(12) United States Patent
Wang et al.

(10) Patent No.: US 6,246,270 B1
(45) Date of Patent: Jun. 12, 2001

(54) INNOVATED AC KICKER FOR HIGH SPEED LOW VOLTAGE SWING DIFFERENTIAL OUTPUT BUFFER WITH TEMPERATURE COMPENSATION

(75) Inventors: Bonnie Wang, Cupertino; Joseph Huang, San Jose; Wayne Yeung, San Francisco; Chiakang Sung, Milpitas; Richard Cliff, Los Altos; Khai Nguyen, San Jose; Xiaobao Wang, Santa Clara; In Whan Kim, Santa Clara, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/345,434

(22) Filed: Jul. 1, 1999

Related U.S. Application Data (60) Provisional application No. 60/091,617, filed on Jul. 2, 1998.

(51) Int. Cl.[7] .................................................. H03K 4/26
(52) U.S. Cl. ........................... 327/111; 327/108; 327/437; 326/68
(58) Field of Search ..................................... 327/108, 111, 327/390, 437, 589; 326/71, 121, 68

(56) References Cited

U.S. PATENT DOCUMENTS

| | | | |
|---|---|---|---|
| 4,362,955 | * 12/1982 | Davenport | 327/111 |
| 5,406,139 | * 4/1995 | Sharpe-Geisler | 326/71 |

* cited by examiner

*Primary Examiner*—Dinh T. Lee
(74) *Attorney, Agent, or Firm*—Morrison & Foerster LLP (57) ABSTRACT

Disclosed is a current booster or kicker for an output amplifier of a programmable logic control or other integrated circuit. The current booster includes a control mechanism and an auxiliary voltage supply. When a change in output state is initiated, the control mechanism connects the auxiliary voltage supply to the output of the output amplifier. After a change in output state in completed, the control mechanism disconnects the auxiliary voltage supply from the output of the output amplifier. In this way, the output amplifier can drive a relatively high capacitance load at a relatively high slew rate.

17 Claims, 5 Drawing Sheets

INNOVATED AC KICKER FOR HIGH SPEED LOW VOLTAGE SWING DIFFERENTIAL OUTPUT BUFFER WITH TEMPERATURE COMPENSATION

CROSS-REFERENCE TO RELATED APPLICATIONS

This application claims the benefit of U.S. Provisional Application No. 60/091,617, filed on Jul. 2, 1998.

TECHNICAL FIELD

The present invention relates to output drivers for programmable logic devices (PLDs) or other integrated circuit (IC) outputs. In particular, the present invention is directed to a current kicker or booster circuit to provide for high speed, low voltage output swing for PLD output drivers.

BACKGROUND ART

Programmable logic devices (PLDs) or other types of integrated circuits (ICs) typically use differential output drivers or buffers to drive their outputs. Output drivers are generally driven from inputs provided internally in the IC.

Figure 1:
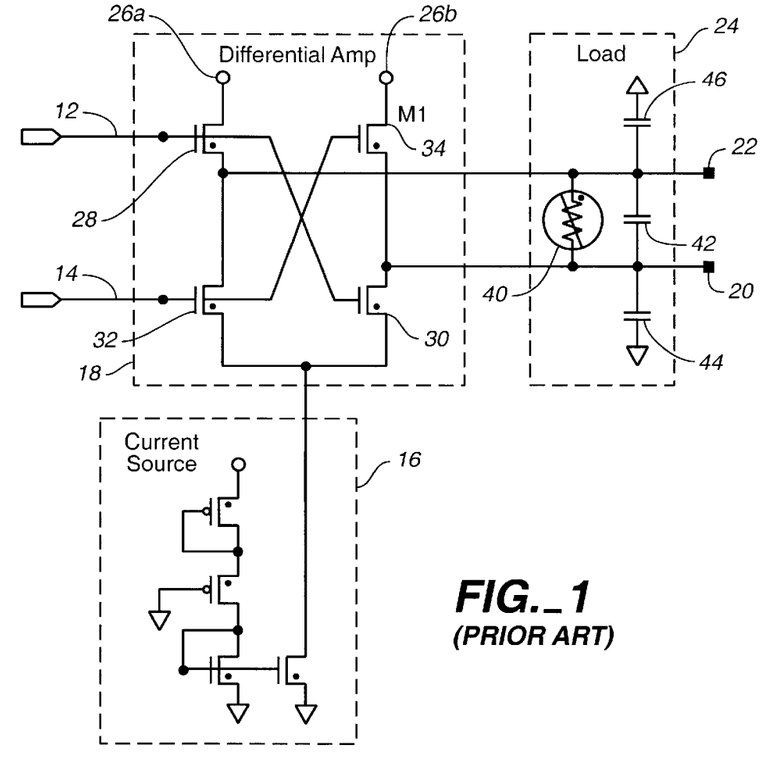
FIG. 1 is a schematic diagram of an earlier IC output driver including a differential amplifier and current source.

FIG. 1 is a schematic diagram of a differential output buffer or driver 10 which could be used in a PLD or other IC. Driver 10 includes a first input 12, a second input 14, a current source 16, differential amplifier 18, and first and second outputs 20 and 22, respectively. FIG. 1 also shows a typical equivalent load circuit 24 which driver 10 would drive.

Differential amplifier 18 includes first and second transistors 28 and 30, respectively, the gates of which are controlled by input line 12 and third and fourth transistors 32 and 34, respectively, the gates of which are controlled by input line 14. Transistors 28–34 are typically all sized approximately the same. The drains of first and fourth transistors 28 and 34 are connected to supply voltages 26a and 26b, respectively. The source of first transistor 28 is connected to the drain of third transistor 32 and to output 22. The source of fourth transistor 34 is connected to the drain of second transistor 30 and to output 20. The sources of second and third transistors 30 and 32, respectively, are connected to current source 16. Current source 16 provides a stiff current to drive load 24 and can be a current mirror, the configuration of which is well known in the art.

Equivalent load 24 typically includes a resistance 40 in parallel with a parasitic capacitance 42 across outputs 22 and 24. Additionally, output 20 is grounded through parasitic capacitance 44 and output 22 is grounded through parasitic capacitance 46. The values of resistance 40 and capacitances 42–46 will vary depending somewhat upon the actual load being driven by driver 10. However, typically resistance 40 can have a value of about 100 ohms and capacitances 42, 44 and 46 can each have a value of about 10 picofarads (pf).

Inputs 12 and 14 are driven to either a digital high state (high) or digital low state (low) by the internal electronics of the PLD or other IC. Configuration of PLDs to drive output driver 10 are well known in the art. When first input 12 is high and second input 14 is low, first and second transistors 28 and 30, respectively, are turned on and third and fourth transistors 32 and 34, respectively, are turned off. Thus, current can pass from voltage supply 26a, through first transistor 28, into second output 22, through load 24 and second transistor 30, and into current source 16. This drives second output 22 to high and first output 20 low. When first input 12 goes low and second input 14 goes high, third and fourth transistors 32 and 34, respectively, are turned on and first and second transistors 28 and 30, respectively, are turned off. Thus, current passes from voltage source 26b into first output 20, through load 24 and to current source 16 through second output 22. In this way, first output 20 is driven high and second output 22 is driven low.

Typically, outputs 20 and 22 are held at a quiescent dc voltage of about 1.25 volts (v). The voltage swings on outputs 20 and 22 are generally from about 0.25 to 0.45 v between a high state and a low state That is, a high state can be from about 1.5 volts to 1.7 volts and a low state can be from about 0.8 to 1.0 volts.

As noted above, industry specifications generally require an output rise/fall time or slew rate of from 0.3 to 0.5 ns. However, this slew rate can be difficult to achieve given the electrical characteristics of equivalent load 24. Specifically, it can be difficult for current source 16 to provide a stiff enough current to drive relatively low resistance 40 and parasitic capacitances 42–46 to achieve such rapid slew rates.

Accordingly, improvement is needed in output drivers for PLDs or other ICs. Specifically, an output driver should be able to drive a capacitive or low impedance load with a relatively high slew rate to achieve industry standards.

SUMMARY OF THE INVENTION

The present invention includes a current booster for use with an integrated circuit output driver. The output driver has at least one output driven by a primary current source. The current booster includes an auxiliary voltage supply which can be connected to the output of the output driver. The current booster also includes a control mechanism which temporarily connects the auxiliary voltage supply to the output during a change in output state of the output driver.

Preferably, the control mechanism connects the auxiliary voltage supply to the output at the start of a change in state of the output and disconnects the auxiliary voltage supply from the output after the completion of the change in state.

In another aspect of the present invention, a method of boosting the current on an output of an integrated circuit output driver having a first input from an integrated circuit and a primary current source to drive a first output, includes detecting a change in the digital state on the first input from the integrated circuit. An auxiliary voltage supply is then connected to the first output to boost the current of the first output during a change in state thereof.

By boosting the current in the output of a integrated circuit output driver during a change in state thereof, the output driver can advantageously drive a relatively high capacitance, or otherwise low impedance, load relatively quickly. Specifically, industry standard specifications for slew rate can be met even when driving relatively high capacitance loads.

DETAILED DESCRIPTION

Figure 2:
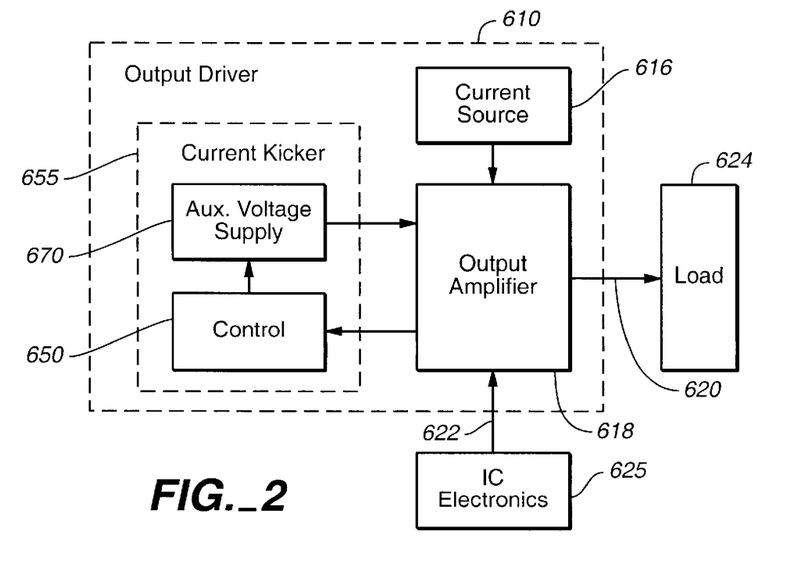
FIG. 2 is a block diagram showing the operation of an IC output driver including an ac kicker in accordance the present invention.

The present invention includes a method and apparatus for boosting the current of and IC output driver during a change in state of the output of the IC. FIG. 2 is a block diagram illustrating an IC output driver 610 in accordance with the present invention. Output driver 610 includes an output amplifier 618, and a current source 616 for providing current to amplifier 618. Output amplifier 618 drives load 624 through at least one output 620 and is driven by internal IC electronics 625 through at least one input 622. Output driver 610 also includes a current kicker or booster 655 for providing additional current to output amplifier 618 during a change in digital state of output 620. Current kicker 655 includes an auxiliary voltage supply 670 to provide additional current to output amplifier 618 during a change in state of output 620 and a control mechanism 650. Control mechanism 650 causes auxiliary voltage supply 670 to provide a current kick or boost to output amplifier 618 during a change in state of output 620. Control mechanism 650 can accomplish this by either monitoring input 622, monitoring output amplifier 618, or any other method of determining when there is a change in digital state on input 622.

Additionally, control mechanism 650 causes auxiliary voltage supply 670 to cease providing additional current to output amplifier 618 after a digital state change has occurred on outputs 620. Control mechanism 650 can accomplish this either by monitoring feedback from output amplifier 618, using a timing mechanism to cut out additional current to output amplifier 618 after a predetermined amount of time, or any other method.

By providing a current kick or boost to output amplifier 618 during a change in state of outputs 620, output driver 610 can advantageously drive a relatively low impedance or high capacitance load 624 at a relatively high slew rate. Specifically, even if load 624 has a relatively high capacitance, output amplifier 618 can advantageously drive load 624 to meet industry standard slew rates. Additionally, because boosting current is cut out after a state change has occurred, industry standard voltage levels can advantageously be maintained on output 620 when no state change is taking place.

Figure 3:
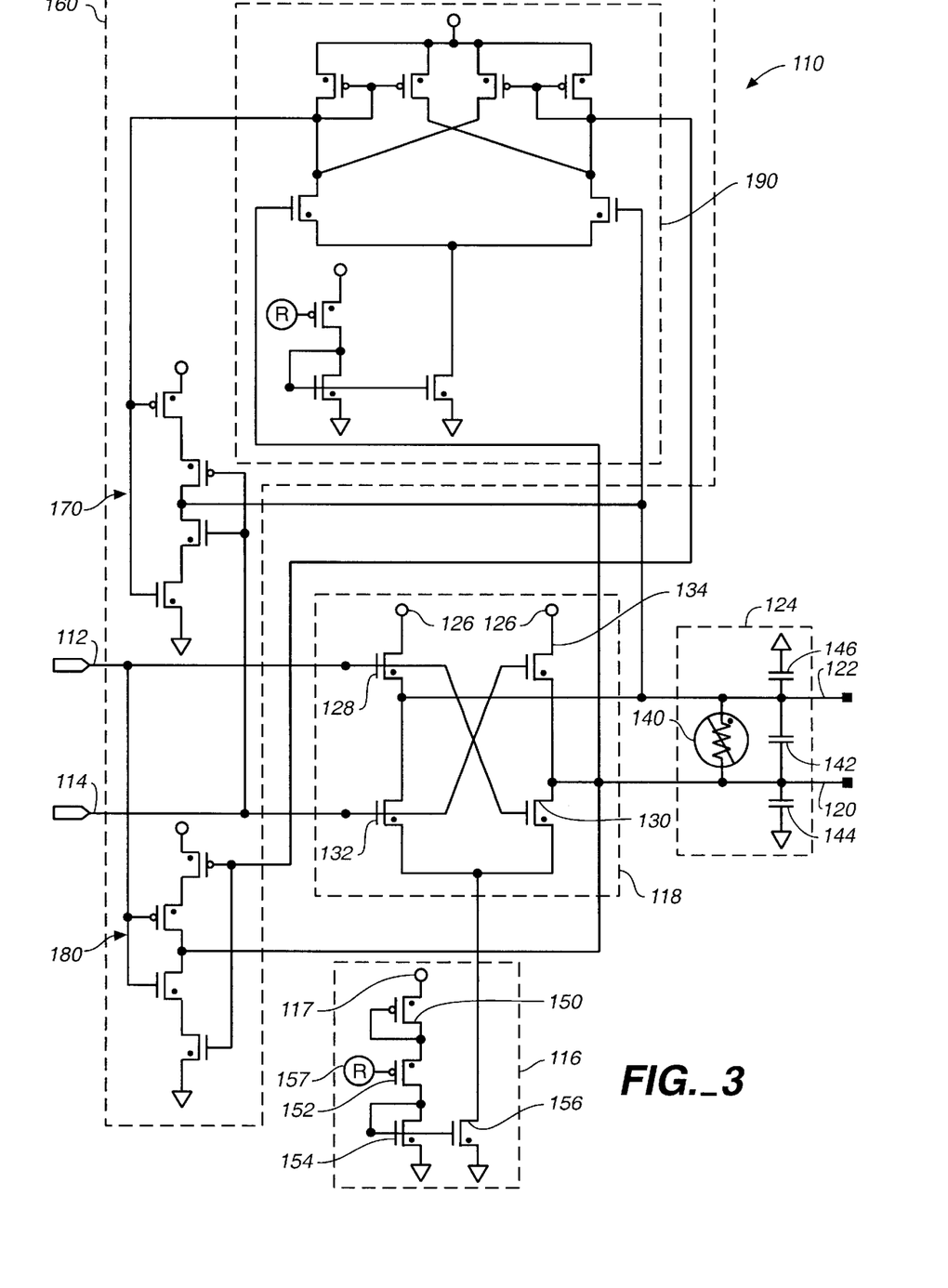
FIG. 3 is a schematic diagram showing a first embodiment of an IC output driver including an ac kicker in accordance with the present invention.

FIG. 3 shows a first embodiment of an output driver 110 for use in driving the output of a PLD or other IC in accordance with the present invention. Output driver 110 includes inputs 112 and 114 for feeding digital high and low signals into driver 110, and outputs 120 and 122 for driving a load. Driver 110 also includes primary current source 116 to provide current to drive outputs 120 and 122. Inputs 112 and 114 feed into differential amplifier 118, which is connected with current source 116 and outputs 120 and 122. Differential amplifier 118 uses current supplied by current source 116 to control the digital state of outputs 120 and 122 depending on the state of inputs 112 and 114, as explained more fully below. FIG. 3 also shows an equivalent load 124 which could be driven by output driver 110. Output driver 110 also includes ac kicker or booster 160 connected to outputs 120 and 122 to provide additional current to outputs 120 and 122 during a state transition thereof. Additionally, output driver 110 includes kicker cutout circuit 190 connected to ac kicker 160 to reduce or cut off the additional current provided to outputs 120 and 122 after a digital state transition thereof.

Current source 116 can be any circuit which provides a relatively constant current to drive load 124. Preferably, as shown in FIG. 3, current source 116 is a current mirror including voltage supply 117, PMOS bias transistor 150, NMOS bias transistor 154, switching transistor 152, and mirror transistor 156. The source of bias transistor 150 is connected to voltage source 117 and the drain of bias transistor 150 is tied to the gate of bias transistor 150 and the source of switching transistor 152. Bias transistors 150 and 154 are matched with mirror transistor 156 and the gate of bias transistor 154 is tied to the gate of mirror transistor 156 and to the drain of transistor 154, which is also connected to the drain of transistor 152.

Further, the drain of transistor 156 is the current source for differential amplifier 118. Therefore, the current through bias transistors 150 and 154 can program or control the current through differential amplifier 118 and load 124. Also, because the drain of programming transistor 154 is connected to voltage source 117 through transistor 152, differential amplifier 118 can be disabled by turning off transistor 152.

To facilitate this, the gate of switching transistor 152 is controlled by a programmable switching element 157. Programmable switching element 157 can programmably turn switching transistor 152 off or on by either grounding the gate of switching transistor 152 or connecting the gate to a bias voltage. In the embodiment shown in FIG. 3, because the gate of switching transistor 152 is inverted, grounding the gate turns switching transistor 152 on and connecting the gate to a bias voltage turns switching transistor off.

Preferably, programmable switching element 157 is a RAM controlled element, however, any programmable switching element which can connect and disconnect the gate of switching transistor between ground and a bias voltage can be used with the present invention. For example, it is also contemplated that switching element 157 be an EPROM, EEPROM, fuse, or antifuse.

By including switching element 157 in current source 116, a differential amplifier such as differential amplifier 118 which is used to drive outputs of a PLD such as outputs 120, 122 can be effectively switched off by de-activating, or turning off, switching transistor 152 This allows the outputs of a PLD to be driven by another differential amplifier, or other device, in the PLD depending upon how switching element 157 is programmed. Thus, the outputs of a PLD can advantageously be programmatically used for multiple purposes. This advantageously allows a PLD to be more versatile.

Equivalent load 124 can be any load which might be driven by output driven 110. However, the example of an equivalent load 124 shown in FIG. 3 is substantially the same as equivalent load 24 shown in FIG. 1. Equivalent load 124 includes resistance 140 in parallel with parasitic capacitance 142 across outputs 122, 124. Also, output 122 is grounded through parasitic capacitance 146 and output 120 is grounded through parasitic capacitance 144.

Differential amplifier 118 can be any type of amplifier which can drive outputs 120 and 122 into load 124 to either a high or low digital state. Preferably, however, differential amplifier 118 is substantially the same as differential amplifier 18 discussed above. Differential amplifier 118 includes first, second, third and fourth transistors 128, 130, 132, and 134, respectively, and voltage supply 126. Preferably, though not necessarily, transistors 128, 130, 132 and 134 are all substantially the same size. Input 112 controls the gates of first and second transistors 128 and 130, respectively, and input 114 control the gates of third and fourth transistors 132 and 134, respectively. Thus, as described above with respect to output driver 10, if first input 112 is high and second input 114 is low, current is routed through differential amplifier 118 and load 124 to drive output 122 high and output 120 low. If second input 114 is high and first input 112 is low, current is routed through differential amplifier 118 and load 124 to drive output 120 high and output 122 low.

Figure 4:
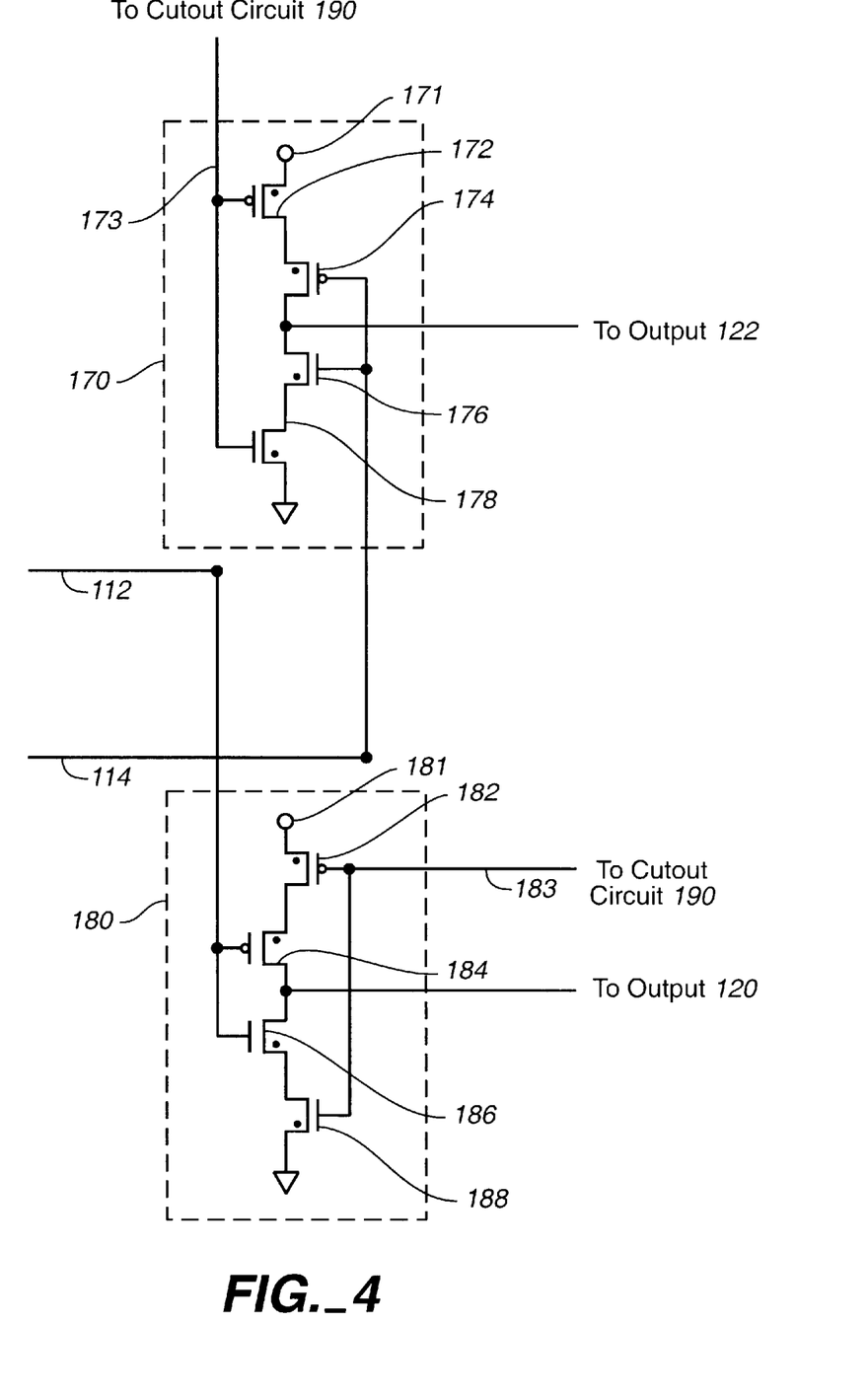
FIG. 4 is a detailed schematic diagram of a portion of the IC output driver shown in FIG. 3 illustrating the ac kicker shown in FIG. 3.

Output driver 110 also includes an ac kicker 160 to provide additional current to outputs 120 and 122 during a change of state thereof. Ac kicker 160 includes first and second switching circuits 170 and 180, respectively, and cutout circuit 190. FIG. 4 is an enlarged view of a preferred embodiment of first and second switching circuits 170 and 180, respectively. First switching circuit 170 is connected to input 114 and output 122 and provides additional current to output 122 during a change in state thereof activated by input 114. Second switching circuit 180 is connected to output 120 and input 112 and provides additional current to output 122 during a change in state thereof activated by input 112.

In the embodiment shown in FIG. 4, first switching circuit 170 includes an auxiliary voltage supply 171, two activation transistors 174 and 176, and two cutout transistors 172 and 178. Transistors 172, 174, 176 and 178 are preferably connected in series between voltage supply 171 and ground. In the shown, activation transistors 174 and 176 are connected between cutout transistors 172 and 178, with the source of cutout transistor 172 connected to voltage supply 171 and the source of cutout transistor 178 connected to ground. Input 114 preferably controls the gates of activation transistors 174 and 176 and cutout circuit 190 controls the gates of cutout transistors 172 and 178. Output 122 is preferably connected to switching circuit 170 between activation transistors 174 and 176. The voltage of voltage supply 171 is preferably about 3.3 volts.

Like first switching circuit 170, in the embodiment shown in FIG. 4, second switching circuit 180 includes an auxiliary voltage supply 181, two activation transistors 184 and 186, and two cutout transistors 182 and 188. Transistors 182–188 are preferably connected in series just as transistors 172–178, with cutout circuit 190 controlling the gates of cutout transistors 182 and 188. However, input 112 preferably controls the gates of activation transistors 184 and 186 and output 120 is preferably connected between activation transistors 184 and 186. The voltage of voltage supply 181 is preferably about 3.3 volts.

As discussed above, when input 114 makes a transition from a high to a low state, output 122 is driven high. At the time of such a transition, first switching circuit 170 preferably connects auxiliary voltage source 171 to output 122 to provide additional current thereto to boost the transition of output 122 from a low to a high state. As will be explained below, as input 114 transitions from high to low, cutout circuit 190 preferably holds line 173 low. Line 173 controls the gates of cutout transistors 172 and 178. Additionally, the gate of cutout transistor 172 is inverted. Thus, at a transition of input 114 from high to low, cutout transistor 172 is on and cutout transistor 178 is off. Further, just after input 114 goes low, because its gate is inverted, activation transistor 174 turns on and activation transistor 176 turns off. Thus, the drain of activation transistor 174, which is connected to output 122, is connected to auxiliary voltage supply 171. This provides a current kick or boost to output 122.

As input 114 goes low, input 112 transitions from a low state to a high state. Additionally, as is explained below, during a transition of input 112 from high to low, cutout circuit 190 holds line 183 high. Line 183 controls the gate of cutout transistor 182, which is inverted, and the gate of cutout transistor 188, which is not inverted. Thus, when line 183 is high, cutout transistor 182 is off and cutout transistor 188 is on. Further, as input 112 goes high, activation transistor 184 turns off, because its gate is inverted, and activation transistor 186 turns on. In this way, output 120 is connected to ground via activation transistor 186 and cutoff transistor 188. This provides output 120 with an additional path to ground to sink additional current supplied to output 122 by auxiliary voltage supply 171.

When input 112 transitions from high to low, and input 114 transitions from low to high, switching circuits 170 and 180 simply switch roles to provide a current boost to output 120. Specifically, when input 112 transitions back to a low state, second switching circuit 180 acts just as first switching circuit 170, as input 114 goes from high to low, to connect auxiliary voltage supply 181 to output 120 to boost current to output 120. And, when input 114 transitions back to a high state, first switching circuit 170 acts just as switching circuit 180, when input 112 goes from low to high, to connect output 122 to ground.

As noted above, during a change of state of inputs 112 and 114, cutout circuit 190 holds the gates of cutout transistors 172, 178, 182 and 188 in either a high or low state to facilitate providing additional current to either output 120 or 122. Additionally, after a transition of inputs 112 and 114, cutout circuit 190 acts to remove the additional boosting current from either output 120 or 122.

Figure 5:
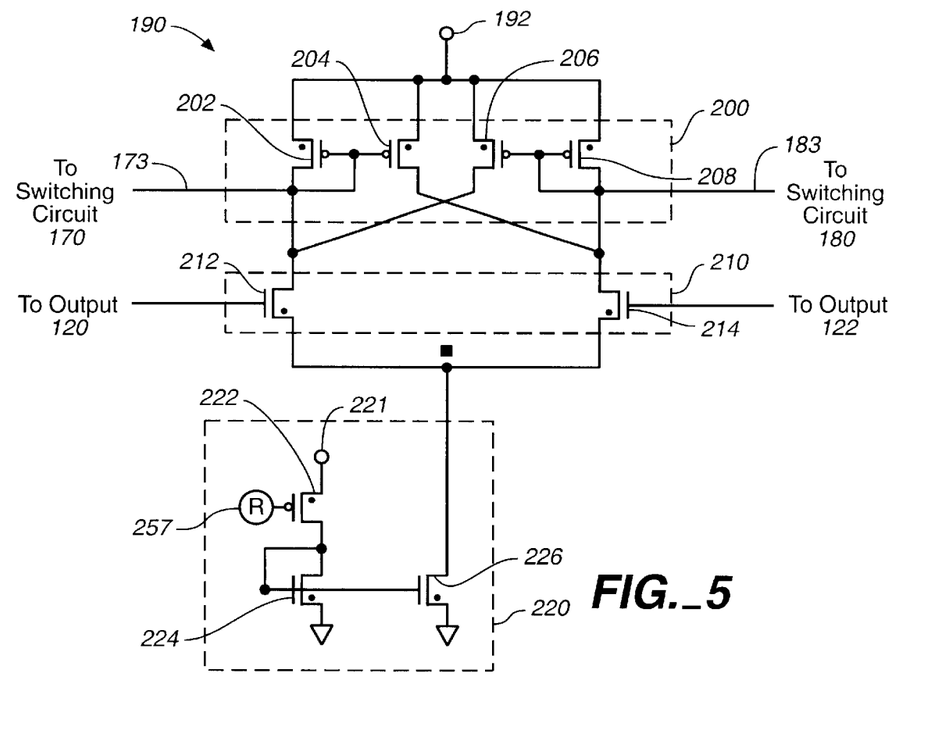
FIG. 5 is a detailed schematic diagram of a portion of the IC output driver shown in FIG. 3 illustrating the ac kicker cutout circuit shown in FIG. 3.

FIG. 5 is an enlarged schematic diagram of one embodiment of a cutout circuit 190 In the embodiment shown in FIG. 5, cutout circuit 190 is essentially a feedback circuit. Cutout circuit 190 preferably includes a differential pair 210 which is connected to outputs 120 and 122 and is for sensing when an output state transition is completed. Cutout circuit 190 also preferably includes a differential load 200 which is connected to a voltage supply 192 and to first and second switching circuits 170 and 180, respectively. Differential load 200 acts to remove the additional current provided by auxiliary voltage supplies 171 and/or 181 after an output state transition is completed.

Additionally, cutout circuit 190 includes a current source 220. In the embodiment shown in FIG. 5, current source 220 is a simple current mirror. However current source 220 can be any current source which will provide a relatively stiff or constant current for differential load 200 and differential pair 210.

In the embodiment shown in FIGS. 3 and 5, differential load 200 preferably includes PMOS transistors, 202, 204, 206 and 208 connected in parallel, with the source of each transistor 202–208 connected to voltage source 192. Also, differential pair 210 preferably includes a first sensing transistor 212 and a second sensing transistor 214. The drains of transistors 202 and 206 are preferably connected to the drain of first sensing transistor 212 of differential pair 210. The drains of transistors 204 and 208 are preferably connected to the drain of second sensing transistor 214. The gates of transistors 202 and 204 are preferably inverted, tied together, and connected to the drain of transistor 202, which is connected to the drain of first sensing transistor 212. Likewise, the gates of transistors 206 and 208 are preferably inverted, tied together, and connected to the drain of transistor 208, which is connected to the drain of second sensing transistor 214. The sources of sensing transistors 212 and 214 are connected to current source 220.

As noted above, in the embodiment shown in FIGS. 3 and 5, current source 220 is a simple current mirror. Current source 220 preferably includes a voltage supply 221, a switching transistor 222, a programming or control transistor 224, and a mirror transistor 226. Preferably, the source of switching transistor 222 is connected to voltage supply 221 and the drain of switching transistor 222 is connected to the drain of control transistor 224. The gates of control transistor 224 and mirror transistor 226 are connected to the drain of control transistor 224. Additionally, the sources of both control transistor 224 and mirror transistor 226 are grounded. Thus, the current through mirror transistor 226 will be controlled by control transistor 224. If mirror transistor 226 and control transistor 224 are the same size, the currents through each will be approximately the same. Preferably, however, the size of mirror transistor 226 is approximately ten times the size of control transistor 224. It is contemplated, however, that mirror transistor 226 be any size relative to control transistor 224.

The drain of mirror transistor 226 is connected to the sources of sensing transistors 212 and 214. Thus, the current in control transistor 224 controls the current in cutout circuit 190. Additionally, in the embodiment shown in FIGS. 3 and 5, the gate of switching transistor 222 is inverted and connected to a programmable switching element 257 which can programmably turn switching transistor 222 off or on by either grounding the gate of switching transistor 222 or connecting the gate to a bias voltage. In the embodiment shown in FIG. 5, because the gate of switching transistor 222 is inverted, grounding the gate turns switching transistor 222 on and connecting the gate to a bias voltage turns switching transistor 222 off. Because current source 220 is the current source for cutout circuit 190, by turning off switching transistor 222, cutout circuit 190 can be disabled.

Preferably, programmable switching element 257 is a RAM controlled element, however, any programmable switching element which can connect and disconnect the gate of switching transistor between ground and a bias voltage can be used with the present invention. For example, it is also contemplated that switching element 257 be an EPROM, EEPROM, fuse, or antifuse.

As noted above, cutout circuit 190 operates to cut off additional current to amplifier 118 after a transition has occurred in outputs 120 and 122. If input 112 is low, then output 122 is low and the gate of second sensing transistor 214 is low. Because the drain of second sensing transistor 214 is connected to voltage supply 192 through transistor 204, when the gate of second sensing transistor 214 is low, the source thereof is high. Thus, line 183, which controls cutoff transistors of switching circuit 180 as described above, is also high. This prepares output 120, which is high if output 122 is low, to be connected to ground through switching circuit 180 upon a change of input state. Additionally, if input 112 is low, then input 114 is high and output 120 is high. This causes sensing transistor 212 to be active which places the drain of sensing transistor 212 in a low state. Thus, line 173 which controls the gates of cutout transistors 172 and 178 of first switching circuit 170, is also low. Therefore, cutout transistor 178 is inactive and cutout transistor 172, which is connected to auxiliary voltage supply 171, is active. In this way, first switching circuit 170 is set up to connect output 122 to auxiliary voltage supply 171 on a change of state of input 114.

As discussed above, when input 112 goes from low to high to cause the state of output 120 to go low, activation transistor 186 of switching circuit 180 is turned on. Because cutout transistor 188 is already active, output 120 is grounded though activation transistor 186 and cutout transistor 188. Additionally, when input 114 goes from high to low to cause the state of output 122 to go high, activation transistor 174 of first switching circuit 170 is turned on. Because cutout transistor 172 of first switching circuit 170 is already active, output 122 is connected to auxiliary voltage supply 171 through activation transistor 174 and cutout transistor 172, boosting the current in output 122.

If the current in output 122 remained boosted after the transition from a low to a high state thereof was complete, the voltage swing in output 122 would be larger than required by industry specifications. Therefore, After output 120 has completed the transition to a low state, sensing transistor 212 of cutout circuit 190 is turned off and the drain of sensing transistor 212 goes high. This causes cutout transistor 172 to turn off, thereby disconnecting auxiliary voltage supply 171 from output 122. Additionally, after output 122 has completed its transition to a high state, sensing transistor 214 is turned on, causing the drain thereof to go low. This causes cutout transistor 188 of second switching circuit 180 to turn off, thereby removing the connection of output 120 to ground.

Additional current provided by auxiliary voltage supplies 171 and 181 allows parasitic capacitances 142–146 to be charged relatively quickly on a change in state of outputs 120 and 122. Therefore, output driver 110 can advantageously drive a relatively high capacitance load such as load 124 to maintain relatively high slew rates. In particular, output driver 110 advantageously can drive a relatively high capacitance load such as load 124 at industry specification slew rates of from about 0.3 ns to about 0.5 ns.

Additionally, cutout circuit 190 is a feedback circuit. That is, cutout circuit 190 receives feedback from output 120 and 122 and is activated only when outputs 120 and 122 have completed a state transition. Accordingly, regardless of whether or not output driver 110 is driving a relatively high capacitance load, additional current supplied to outputs 120 and 122 is advantageously cutout after a state change is completed. Thus, even if output driver is not driving a relatively high capacitance load, and the additional current generates a slew rate of less that 0.3 ns, when the state change is completed, the additional current is still cutout and industry standard voltages of about 0.25 to 0.45 volts, around a dc voltage of about 1.25 volts, can be maintained.

Figure 6:
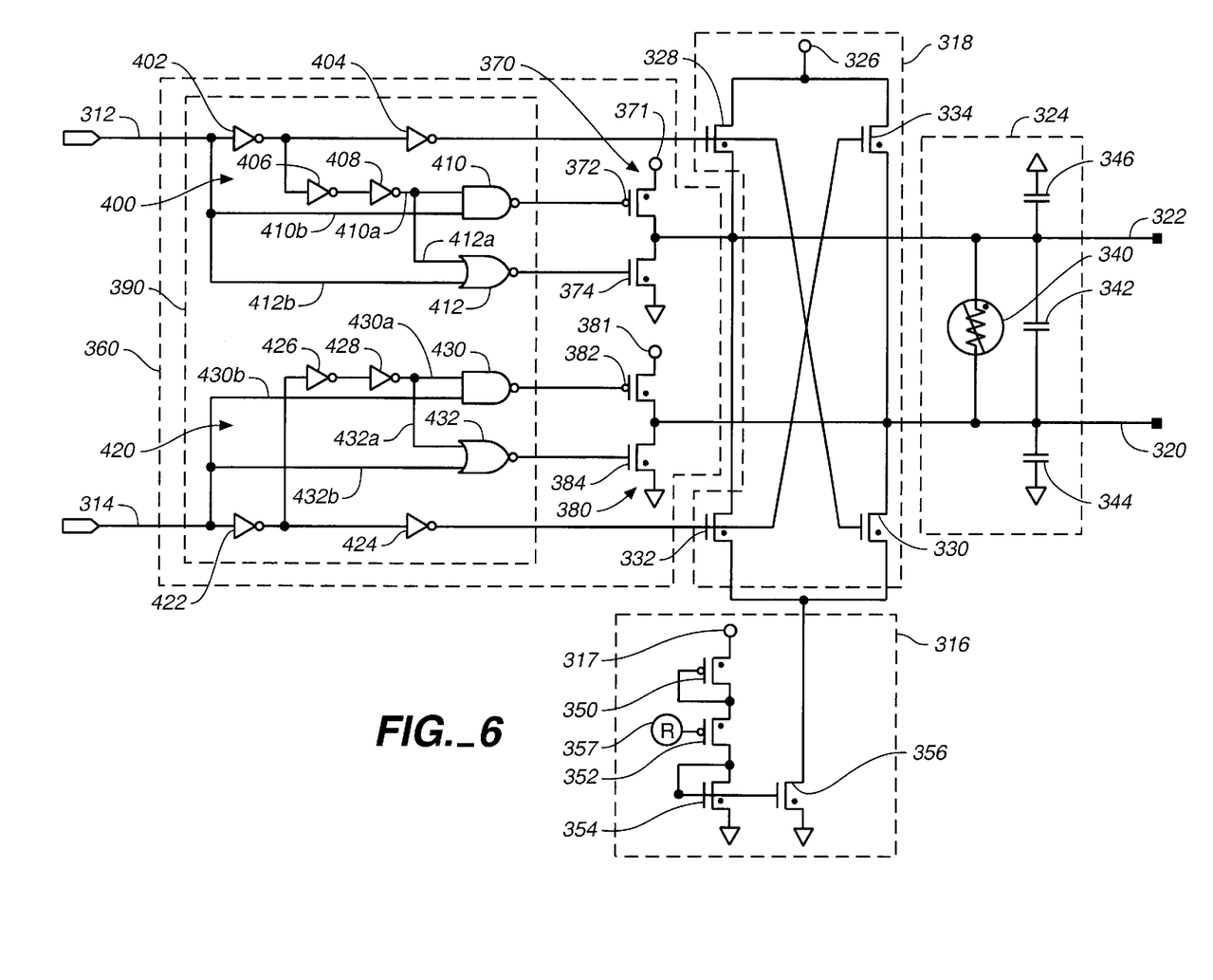
FIG. 6 is a schematic diagram of a second embodiment of an IC output driver including an ac kicker in accordance with the present invention.

FIG. 6 shows a second embodiment of an output driver 310 for a PLD or other IC in accordance with the present invention. Output driver 310 includes inputs 312 and 314, outputs 320 and 322 to drive a load from output driver 310, a differential amplifier 318 to drive outputs 320 and 322 to either a high or low digital state, and a current source 316 to provide current to differential amplifier 318. FIG. 6 also shows an equivalent load 324 which meets industry specifications for a load that output driver 310 might drive.

Inputs 312 and 314 are connected to differential amplifier 318 which includes transistors 328, 330, 332 and 334 and voltage supply 326. Transistors 328, 330, 332 and 334 are interconnected in the same way as transistors 128, 130, 132 and 134, respectively, of differential amplifier 118. Also differential amplifier 318 operates in substantially the same way as differential amplifier 118 to cause outputs 320 and 322 to change from a digital high state to a digital low state and vice-versa.

Differential amplifier 318 is connected to current source 316. Current source 316 includes voltage supply 317; bias transistor 350, the gate of which is connected to programmable switching element 357; switching transistor 352; control transistor 354; and mirror transistor 356. Voltage supply 317 and transistors 350, 352, 354 and 356 are connected in the same way as voltage supply 117 and transistors 150, 152, 154 and 156, respectively. Also, current source 316 operates in substantially the same manner as current source 116 to provide a current supply for differential amplifier 318 to drive outputs 320 and 322. Programmable switching element 357 is substantially the same as programmable switching element 157 and operates in substantially the same way to allow output driver to be enabled or disabled.

Load 324 includes resistance 340 and parasitic capacitances 342, 344 and 346 which have the same values and are interconnected in the same way as resistance 140 and parasitic capacitances 142, 144 and 146, respectively, of equivalent load 124.

Output driver 310 also includes ac kicker 360. Ac kicker 360 is for providing additional current to drive outputs 320 and 322 during a digital state transition thereof. As discussed above, this additional current is necessary to maintain an industry specification slew rate of about 0.3 ns to about 0.5 ns into relatively high capacitance load 324. After a digital transition of outputs 320 and 322 is completed, ac kicker 360 then removes the additional current. This allows industry specified voltage of about 0.25 to about 0.45 volts, around a dc voltage of about 1.25 volts, to be maintained between outputs 320 and 322.

In the embodiment shown in FIG. 6 ac kicker 360 includes a first switching circuit 370, a second switching circuit 380 and a cutout circuit 390. First switching circuit 370 is for providing additional current to output 322 during a state change from a digital low state to a digital high state. Second switching circuit 380 performs this same function for output 320. Additionally, first switching circuit 370 provides an additional path to ground for current in output 322 during a state change thereof from a digital high state to a digital low state. Second switching circuit 380 also performs an identical function for output 320. In the embodiment shown in FIG. 6, first switching circuit 370 includes an auxiliary voltage supply 371, an activation transistor 372 and a grounding transistor 374. Preferably, activation transistor 372 is connected in series with grounding transistor 374 between auxiliary voltage supply 371 and ground. Second switching circuit 380 preferably includes an auxiliary voltage supply 381, an activation transistor 382 and a grounding transistor 384. Activation transistor 382 is preferably connected in series with grounding transistor 384 between auxiliary voltage supply 381 and ground.

Cutout circuit 390 preferably cuts out additional current to amplifier 318 after a predetermined amount of time. First switching circuit 370 is connected to a first delay circuit 400 of cutout circuit 390 and second switching circuit 380 is connected to a second delay circuit 420 of cutout circuit 390. Specifically, gates of activation transistor 372 and grounding transistor 374 are controlled by first delay circuit 400 and gates of activation transistor 382 and grounding transistor 384 are controlled by second delay circuit 420. Additionally, gates of transistors 328 and 330 of differential amplifier 318 are also controlled by delay circuit 400 and gates of transistors 330 and 332 of differential amplifier 318 are controlled by delay circuit 420. Delay circuit 400 is, in turn, driven by input 312 and delay circuit 420 is driven by input 314.

First delay circuit 400 causes first switching circuit 370 to provide additional current from auxiliary voltage supply 371 to output 322 during a transition from a low state to a high state of output 322. After a predetermined delay, first delay circuit 400 then causes first switching circuit 370 to remove the additional current from output 322 by switching out auxiliary voltage supply 371. First delay circuit 400 includes two inverting delays 402 and 404 in series between input 312 and the gates of transistors 328 and 330. First delay circuit 400 also includes NAND gate 410 which drives the gate of activation transistor 372, which is a PMOS device, and NOR gate 412 which drives the gate of grounding transistor 374. NAND gate 410 has inputs 410a and 410b. Input 410a is driven by input 312 through three inverting delays 402, 406 and 408, and input 410b is driven directly by input 312. NOR gate 412 has inputs 412a and 412b. Input 412a is driven by input 312 through three inverting delays 402, 406 and 408 and input 412b is driven directly by input 312. Inverting delays 402, 404, 406 and 408 invert the input and delay the inverted signal from passing to their outputs for a predetermined amount of time. Preferably, the delay time is equivalent to the required slew rate of outputs 320 and 322, that is, from approximately 0.3 ns to approximately 0.5 ns. Also, preferably, each inverting delay generates approximately the same delay time.

To explain the operation of cutout circuit 390, it is useful to consider five times; t=1, t=2, t=3, t=4 and t=5. Time t=1 is the time at which input 312 changes state from low to high and each subsequent time occurs an amount of time approximately equal to the delay time of an inverting delay 402–408 from the previous time. That is, time t=2 occurs approximately one delay time after t=1 and t=3 occurs approximately 1 delay time after t=2, etc. Given the interconnections of inverting delay circuits 402–408, gates 410 and 412, input 312 and gates of transistors 328, 372 and 374 described above and shown in FIG. 6, chart 1 below shows the states of input 312, inputs 410a, 410b, 412a, 412b and gates of transistors 328, 330, 372 and 374 at times t=1 through t=5.

chart 1

|  | t = 1 | t = 2 | t = 3 | t = 4 | t = 5 |
| --- | --- | --- | --- | --- | --- |
| In 312 | L to H | H | H | H | H |
| In 410a | H | H | H | H to L | L |
| In 410b | L to H | H | H | H | H |
| In 412a | H | H | H | H to L | L |
| In 412b | L to H | H | H | H | L |
| Gate 328 | L | L | L to H | H | H |
| Gate 330 | L | L | L to H | H | H |
| Gate 372 | H | H to L | L | L | L to H |
| Gate 374 | L | L | L | L | L |

In chart 1, "L" stands for a digital low state, "H" stands for a digital high state and "L to H" or "H to L" stands for a transition from a low to a high state or high to a low state, respectively. In the same way discussed above with respect to transistors 128 and 130 of differential amplifier 118, when gates of transistors 328 and 330 go high, then output 322 transitions from a low to a high state. As shown in chart 1, for a transition from low to high of input 312 at t=1, gates of transistors 328 and 330 go from low to high at t=3. Additionally, because input 410a of NAND gate 410 is high at t=1 and input 410b goes from low to high at t=1, gate of transistor 372 goes from high to low at t=2 (NAND gate 410 also acts as a delay). Because transistor 372 is a PMOS device, it becomes active when its gate goes low. Thus, at t=2 auxiliary voltage supply 371 is connected to output 322.

Thus, when gates of transistors 328 and 330 go high at t=3, to connect voltage supply 326 to output 322, auxiliary voltage supply 371 is already connected to output 322 and the current through output 322 is kicked or boosted.

At t=5, because input 410a to NAND gate 410 goes from high to low at t=4, and input 410b remains high, gate of transistor 372 goes high, and auxiliary voltage supply 371 is disconnected from output 322. This leaves only voltage supply 326 to provide current for output 322. This allows industry specified voltages to be maintained on outputs 320 and 322 until another state change is initiated by inputs 312 and 314.

As input 312 transitions from a low state to a high state, input 314 transitions from a high state to a low state. Thus, as output 322 transitions from a low state to a high state, output 320 transitions from a high state to a low state. Accordingly, as first delay circuit 400 performs the function described above, second delay circuit 420 causes switching circuit 380 to provide a path to ground for current in output 320 as output 320 transitions from a digital high state to a digital low state. After a predetermined delay, second delay circuit 420 causes switching circuit 380 to remove the provided ground path for output 320. Second delay circuit includes two inverting delays 422 and 424 in series between input 314 and the gates of transistors 332 and 334. Second delay circuit 420 also includes NAND gate 430 which drives the gate of activation transistor 382, which is a PMOS device, and NOR gate 432 which drives the gate of grounding transistor 384. NAND gate 430 has inputs 430a and 430b. Input 430a is driven by input 314 through three inverting delays 422, 426 and 428, and input 430b is driven directly by input 314. NOR gate 432 has inputs 432a and 432b. Input 432a is driven by input 314 through three inverting delays 422, 426 and 428 and input 432b is driven directly by input 314. Inverting delays 422, 424, 426 and 428 preferably invert the input and delay the inverted signal from passing to their respective outputs for approximately the same amount of time as inverting delays 402, 404, 406 and 408 (preferably, the slew rate of outputs 320 and 322, from about 0.3 ns to about 0.5 ns).

Again, considering times t=1, t=2, t=3, t=4, and t=5, and given the interconnections of inverting delay circuits 422–428, gates 430 and 432, input 314 and gates of transistors 332, 382 and 384 described above and shown in FIG. 6, chart 2 below shows the states of input 314, inputs 430a, 430b, 432a, 432b and gates of transistors 332, 334, 382 and 384 at times t=1 through t=5.

chart 2

|          | t = 1  | t = 2  | t = 3  | t = 4  | t = 5  |
|----------|--------|--------|--------|--------|--------|
| In 314   | H to L | L      | L      | L      | L      |
| In 430a  | L      | L      | L      | L to H | H      |
| In 430b  | H to L | L      | L      | L      | L      |
| In 432a  | L      | L      | L      | L to H | H      |
| In 432b  | H to L | L      | L      | L      | L      |
| Gate 332 | H      | H      | H to L | L      | L      |
| Gate 334 | H      | H      | H to L | L      | L      |
| Gate 382 | L      | L      | L      | L      | H      |
| Gate 384 | L      | L to H | H      | H      | H to L |

As in chart 1, in chart 2, "L" stands for a digital low state, "H" stand for a digital high state and "L to H" and "H to L" stands for a transition from a low to a high state and high to a low state, respectively. When gates of transistors 332 and 334 go low, then output 320 transitions from a high to a low state. As shown in chart 2, a transition from high to low of input 314 at t=1 causes gates of transistors 332 and 334 go from high to low at t=3. Additionally, because input 432a is low at t=1, and input 432b goes from H to L at t=1, gate of grounding transistor 384 goes from low to high at t=2 (NOR gate 432 acts as a delay). In this way, output 320 is provided an additional path to ground through grounding transistor 384. This occurs at the same time, t=2, that current is boosted in output 322 by connection thereof to auxiliary voltage supply 371, as explained above.

Because input 432a of NOR gate 432 goes from low to high at t=4, and input 432b remains low, at t=5 the gate of grounding transistor 384 goes from high to low, and the additional path to ground for output 320 is removed (NOR gate 432 acts as a delay). This occurs at the same time, t=5, that auxiliary voltage source 371 is disconnected from output 322, as explained above. By removing the additional path to ground through grounding transistor 384 substantially simultaneously with disconnection from auxiliary voltage source 371, industry specified voltages can be maintained on outputs 320 and 322 until another state change is initiated at inputs 312 and 314.

When input 312 transitions back from a high state to a low state, delay circuit 400 and first switching circuit 370 act in the manner described above regarding delay circuit 420 and second switching circuit 380, to provide an additional path to ground for output 322 from time t=2 to time t=5. Additionally, when input 314 transitions back from a low state to a high state, delay circuit 420 and second switching circuit 380 act in the manner described above regarding delay circuit 400 and first switching circuit 370, to connect output 320 to auxiliary voltage supply 381. This advantageously provides an additional boost of current for output 320 to charge parasitic capacitances 342, 344 and 346 of load 324 in the industry standard slew rate time of between 0.3 and 0.5 ns.

It will be understood that the foregoing is merely illustrative of the principles of this invention, and that various modifications can be made by those skilled in the art without departing from the scope and spirit of the invention.

What is claimed is:

1. A current booster for use with an output driver of an integrated circuit, the output driver having at least a first output connectable to a primary current source and a path to ground, the current booster comprising:

an auxiliary voltage supply connectable to the first output; and at least a first controller responsive to at least the first output, wherein the first controller temporarily connects the auxiliary voltage supply to the first output during a first change in output state of the output driver, further wherein said first controller temporarily connects the first output to an additional path to ground during a second change in the output state of the output driver.

2. The current booster of claim 1 wherein:

the integrated circuit output driver includes at least a first input from the integrated circuit, the first input controlling the state of the first output; and the first controller connects the auxiliary voltage supply to the first output when the first input changes from a digital low state to a digital high state.

3. The current booster of claim 2 wherein the first controller disconnects the auxiliary voltage supply from the first output after the first output has changed from a digital low state to a digital high state.

4. The current booster of claim 3 wherein the first controller includes a first switch responsive to an integrated circuit signal input into the output driver from the first input and to connect and disconnect the auxiliary voltage supply to the first output.

5. The current booster of claim 4 further including a feedback circuit which provides feedback from the first output to the first controller to allow the first controller to detect the completion of a state change of the first output from a digital low state to a digital high state.

6. The current booster of claim 4 further including a timing circuit which causes the first controller to disconnect the auxiliary voltage supply from the first output after a predetermined amount of time.

7. The current booster of claim 1 wherein:
the output driver includes a second output connectable to both the primary current source and the auxiliary voltage supply, and which changes state in the opposite direction of the first output when the first output changes state;
the current booster includes the additional path to ground, where the additional path to round is individually connectable to the first output and second output; and
the first controller includes a second switch which connects the additional path to ground to the one of either the first output and second output during a transition from a digital high state to a digital low state of one of either the first output and second output.

8. An integrated circuit output driver comprising:
at least a first output;
a primary current source connectable to the first output and for driving the first output; and
a current booster including;
at least one auxiliary voltage supply connectable to the first output; and
a controller which temporarily connects the auxiliary voltage supply to the first output during a first change in output state of the output driver and which temporarily connects the first output to an additional ground path during a second change in the output state of the output driver.

9. The integrated circuit output driver of claim 8 including a first input from the integrated circuit and wherein the controller of the current booster connects the auxiliary voltage supply to the first output when the first input changes from a digital low state to a digital high state.

10. The integrated circuit output driver of claim 9 including a feedback circuit which provides feedback from at least the first output to the controller which allows the controller to detect the completion of a state change of the first output.

11. The integrated circuit output driver of claim 10 including a timing circuit connected to the controller which disconnects the auxiliary voltage supply from the first output a predetermined amount of time after the auxiliary voltage supply is connected to the first output.

12. The integrated circuit output driver of claim 8 wherein:
the output driver includes a second output connectable to both the primary current source and the auxiliary voltage supply, and which changes state in a opposite direction from the first output when the first output changes state;
the current booster includes the additional path to ground, where the additional path to ground is individually connectable to the first output and the second output;
the controller of the current booster connects the additional path to ground to the one of either the first output and second output during a transition from a digital high state to a digital low state of one of either the first output and second output.

13. A method of boosting current on an output of an integrated circuit output driver having at least a first input, a first output which changes digital state in response to a digital state change of the first input, a second output, and a primary current source to drive the first output, the method including:
detecting a change in the digital state on the first input from the integrated circuit;
connecting an auxiliary voltage supply to the first output to boost the current of the first output during a change in state thereof; and
connecting the second output to an additional path to ground during the change in state.

14. The method of claim 13 including:
detecting a completion of the change in state of the first output; and
disconnecting the auxiliary voltage supply from the first output after a change in state thereof is completed.

15. The method of claim 14 wherein detecting a completion of the change in state of the first output includes feeding back a signal from the first output to a controller which connects and disconnects the auxiliary voltage supply to the first output.

16. The method of claim 14 wherein disconnecting the auxiliary voltage supply includes disconnecting the auxiliary voltage supply from the first output a predetermined amount of time after the auxiliary voltage supply is connected to the first output.

17. The method of claim 14 including:
providing the second output from the output driver, where the second output changes state in an opposite direction from the first output; and
connecting one of either the first output and second output to the additional path to ground during a state change from a digital high state to a digital low state of either the first output and the second output.

* * * * *